(12) United States Patent
De Angeli et al.

(10) Patent No.: US 7,191,265 B1
(45) Date of Patent: Mar. 13, 2007

(54) JTAG AND BOUNDARY SCAN AUTOMATIC CHAIN SELECTION

(75) Inventors: Marco De Angeli, Barzana (IT); Loc Thi Xuan Dang, San Jose, CA (US); Gregory Dupree, Petaluma, CA (US); Roberto Gianella, Milan (IT); Thomas Hamilton, Milpitas, CA (US); Steven Lowe, Frisco, TX (US); Marco Portinari, Bresso (IT)

(73) Assignee: Cisco Technology, Inc., San Jose, CA (US)

( * ) Notice: Subject to any disclaimer, the term of this patent is extended or adjusted under 35 U.S.C. 154(b) by 185 days.

(21) Appl. No.: 10/425,388

(22) Filed: Apr. 29, 2003

(51) Int. Cl.
G06F 13/40 (2006.01)
G01R 31/317 (2006.01)
G01R 31/3185 (2006.01)
G01R 31/3187 (2006.01)
G06F 13/22 (2006.01)
G01R 31/3177 (2006.01)

(52) U.S. Cl. .................. 710/104; 714/30; 714/724; 714/727; 714/729

(58) Field of Classification Search ............... 710/100, 710/300, 305; 714/724, 726, 727, 733
See application file for complete search history.

(56) References Cited

U.S. PATENT DOCUMENTS

| | | | | |
|---|---|---|---|---|
| 5,329,533 A * | 7/1994 | Lin | ............................ | 714/727 |
| 5,336,951 A * | 8/1994 | Josephson et al. | ............ | 326/38 |
| 5,412,260 A | 5/1995 | Tsui et al. | ..................... | 326/39 |
| 5,640,521 A * | 6/1997 | Whetsel | ...................... | 710/316 |
| 5,828,824 A * | 10/1998 | Swoboda | ..................... | 714/25 |
| 5,862,152 A | 1/1999 | Handly et al. | ........... | 371/22.32 |
| 6,044,025 A | 3/2000 | Lawman | ..................... | 365/191 |
| 6,115,763 A * | 9/2000 | Douskey et al. | ............. | 710/72 |
| 6,158,032 A * | 12/2000 | Currier et al. | ............. | 714/726 |
| 6,421,812 B1 | 7/2002 | Wang et al. | .................. | 716/5 |
| 6,834,366 B2 * | 12/2004 | Kim et al. | .................. | 714/734 |
| 6,836,866 B2 * | 12/2004 | Nolles et al. | ............... | 714/733 |
| 7,003,707 B2 * | 2/2006 | Whetsel | ..................... | 714/727 |
| 2001/0037479 A1 * | 11/2001 | Whetsel | ..................... | 714/724 |
| 2001/0037480 A1 * | 11/2001 | Whetsel | ..................... | 714/727 |
| 2002/0104052 A1 * | 8/2002 | Nolles et al. | ............... | 714/733 |
| 2002/0133795 A1 * | 9/2002 | Yamada | ......................... | 716/4 |
| 2003/0018939 A1 * | 1/2003 | Kinoshita et al. | ........... | 714/742 |
| 2006/0064613 A1 * | 3/2006 | Whetsel | ..................... | 714/724 |

OTHER PUBLICATIONS

Agilent Technologies; "Boundar Scan Theory Overview"; Dynamic Details Incorporated; Apr. 3, 2001; all pages.*

* cited by examiner

*Primary Examiner*—Paul R. Myers
*Assistant Examiner*—Ryan Stiglic
(74) *Attorney, Agent, or Firm*—Cindy Kaplan

(57) ABSTRACT

A printed circuit board (PCB) may be used in a first mode where boundary scan techniques are used to externally program and/or test devices on the PCB, or a second mode where an internal source programs devices using boundary scan techniques. In one implementation, there is also additional flexibility to include or skip devices in a boundary scan chain and to accommodate non-scan related functions for pins used for scanning. These various modes of operation may be selected by activating and deactivating buffers.

26 Claims, 7 Drawing Sheets

JTAG AND BOUNDARY SCAN AUTOMATIC CHAIN SELECTION

BACKGROUND OF THE INVENTION

The present invention relates to electronic circuitry and more particularly to systems and methods for testing and/or programming.

The complexity of the electronic circuitry on printed circuit boards (PCBs) continues to increase. A single PCB may have a very large number of integrated circuits. With continued progress in large scale integration, many of these integrated circuits may have tens of millions or even hundreds of millions of transistors. As the amount of circuitry on a single integrated circuit increases, so does the number of input/output pins. There is also a very high density of interconnections among the integrated circuits.

With the increased complexity comes a very great challenge in testing the PCBs and debugging faults in an efficient manner. Also, many of the devices on the board may be programmable logic devices (PLDs) such as PROMs, FPGAs, CPLDs, etc. Thus, the configuration of the PCB may involve downloading a very large amount of programming information into multiple programmable devices.

To reduce the burden of testing PCBs, integrated circuit vendors often incorporate extra hardware within their integrated circuit to facilitate testing and debugging. IEEE standard 1149.1, also referred to as JTAG or Boundary Scan, specifies a serial interface in combination with an internal state machine to facilitate external testing of compliant devices. To minimize the need for numerous test connections to the PCB, the serial interfaces of multiple devices may be connected together in what is referred to as a scan chain. The IEEE standard 1149.1 may also be used for external programming of devices on a PCB. It is also known to use JTAG to program a programmable device from a source internal to the PCB.

What is needed are systems and methods that provide flexibility in switching between external JTAG testing and/or programming and internal JTAG programming.

SUMMARY OF THE INVENTION

By virtue of embodiments of the present invention, a printed circuit board (PCB) may be used in a first mode where boundary scan techniques are used to externally program and/or test devices on the PCB, or a second mode where an internal source on the PCB programs devices using boundary scan techniques. In one implementation, there is also additional flexibility to include or skip devices in a boundary scan chain and to accommodate non-scan related functions for pins used for scanning. These various modes of operation may be selected by activating and deactivating buffers.

A first aspect of the present invention provides a method of operating a card having a plurality of devices. The method includes: providing a plurality of devices, each of the devices having a serial interface for programming and/or testing, operating the card in a first mode wherein a first one of the plurality of devices is programmed or tested via an external connector and the serial interface, switching the card from the first mode to a second mode wherein a second one of the plurality of devices is programmed from a source internal to the card and the serial interface; and operating the card in the second mode.

A second aspect of the present invention provides apparatus for operating a card. The apparatus includes: a plurality of devices, each of the devices having a serial interface for programming and/or testing, an external connector, and a multiplexer. In a first mode the multiplexer selects signals from the external connector to externally program and/or test a selected one of the plurality of devices via its serial interface. In a second mode, the multiplexer selects signals from an internal programming source to program the selected one of the plurality of devices via its serial interface.

Further understanding of the nature and advantages of the inventions herein may be realized by reference to the remaining portions of the specification and the attached drawings.

DESCRIPTION OF SPECIFIC EMBODIMENTS

The present invention will be described with reference to a representative embodiment where multiple electronic devices are mounted on a PCB. Some of the devices are equipped with serial interfaces to implement boundary scan techniques, e.g., such as the ones specified by the IEEE 1149.1 standard, also referred to as JTAG. The contents of the IEEE 1149.1 standard are herein incorporated by reference in their entirety for all purposes. The specified serial interface involves five pins. Devices may be connected together via their serial interfaces into scan chains. The present invention provides great flexibility in configuring and reconfiguring scan chains.

Figure 1:
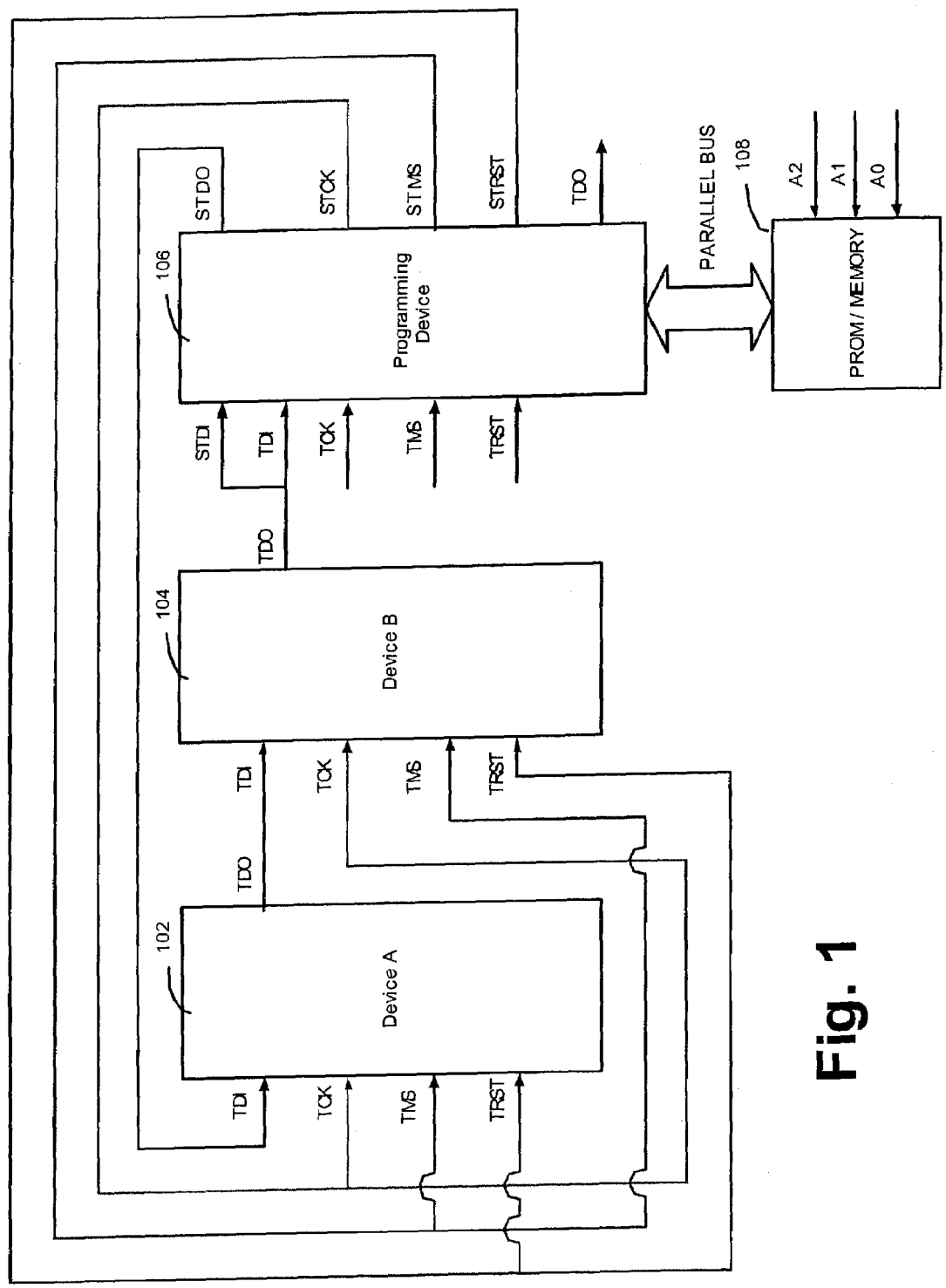
FIG. 1 depicts a scan chain as would be used for programming devices from an internal source according to one embodiment of the present invention.

FIG. 1 depicts a scan chain as might be used to program devices on a PCB from an internal source according to one embodiment of the present invention. Four integrated circuit devices are depicted: a programmable logic device A 102, a programmable logic device B 104, a programming device 106, and a memory device 108 which may be, e.g., a programmable read-only memory (PROM). It is desirable to use programming device 106 to load programming information from memory device 108 into programmable logic device A 102 and programmable logic device B 104 upon boot-up of the PCB. For simplicity of illustration only the pins relating to the functionality provided by the present invention are shown.

On devices 102, 104, and 106, there are five pins corresponding to the JTAG serial interface. These pins include a TDI pin for scanning in test and/or programming data, a TDO for scanning out testing and/or programming data, a TCK pin for clocking boundary scan operations, a TMS pin for selecting test modes in accordance with the JTAG standard, and a TRST pin to reset a device(s). The TRST pin need not be included in every JTAG device implementation. Programming device 106 may be, e.g., an FPGA, ASIC, microcontroller, microprocessor, etc. Programming device 106 is coupled to memory device 108 via a parallel bus as known in the art. Programming device 106 acts as a source of JTAG stimulus information for accomplishing the desired programming operations through the configured scan chain.

To perform programming operations, programming device 106 is equipped with "simulated" JTAG serial interface outputs including STDO which acts as the serial programming data source, STCK which provides the JTAG clock, STMS which provides the JTAG mode select information, and STRST to provide the JTAG reset signal. Programming device 106 is also provided with an STDI input which is used for completing the JTAG chain. Programming device 106 also has primary JTAG serial interface pins TDI, TCK, TMS, TDO and TRST to accommodate external testing and/or programming as will be later illustrated and described with reference to FIG. 2. There are thus two JTAG interfaces, the standard one with pins TDI, TCK, TMS, TDO, and TRST, and the simulated one with pins STDI, STCK, STMS, STDO, and STRST.

In FIG. 1, the scan chain for transfer of serial programming data can be seen to consist of a connection between STDO of programming device 106 and TDI of device A 102, a connection between TDO of device A 102 and TDI of device B 104, and a connection between TDO of device B 104 and STDI of programming device 106. The STCK of programming device 106 is connected to the TCK inputs of device A 102 and device B 104 and the STMS and STRST outputs of programming device 106 is connected in a similar manner. In one implementation, programming device 106 automatically begins a programming sequence upon board power-up to retrieve programming data from memory device 108 to first program itself and then program the other devices. In this configuration, programming device 106 is the bus master for JTAG operation. Pins A0, A1, and A2 allow selection of one of 8 sets of programming data to be loaded into programming device 106. These pins can be either externally sourced or driven by a register cleared only upon power-on reset. This register may be internal to a programmable device of the PCB and configured by external commands addressed to such a device.

Figure 2:
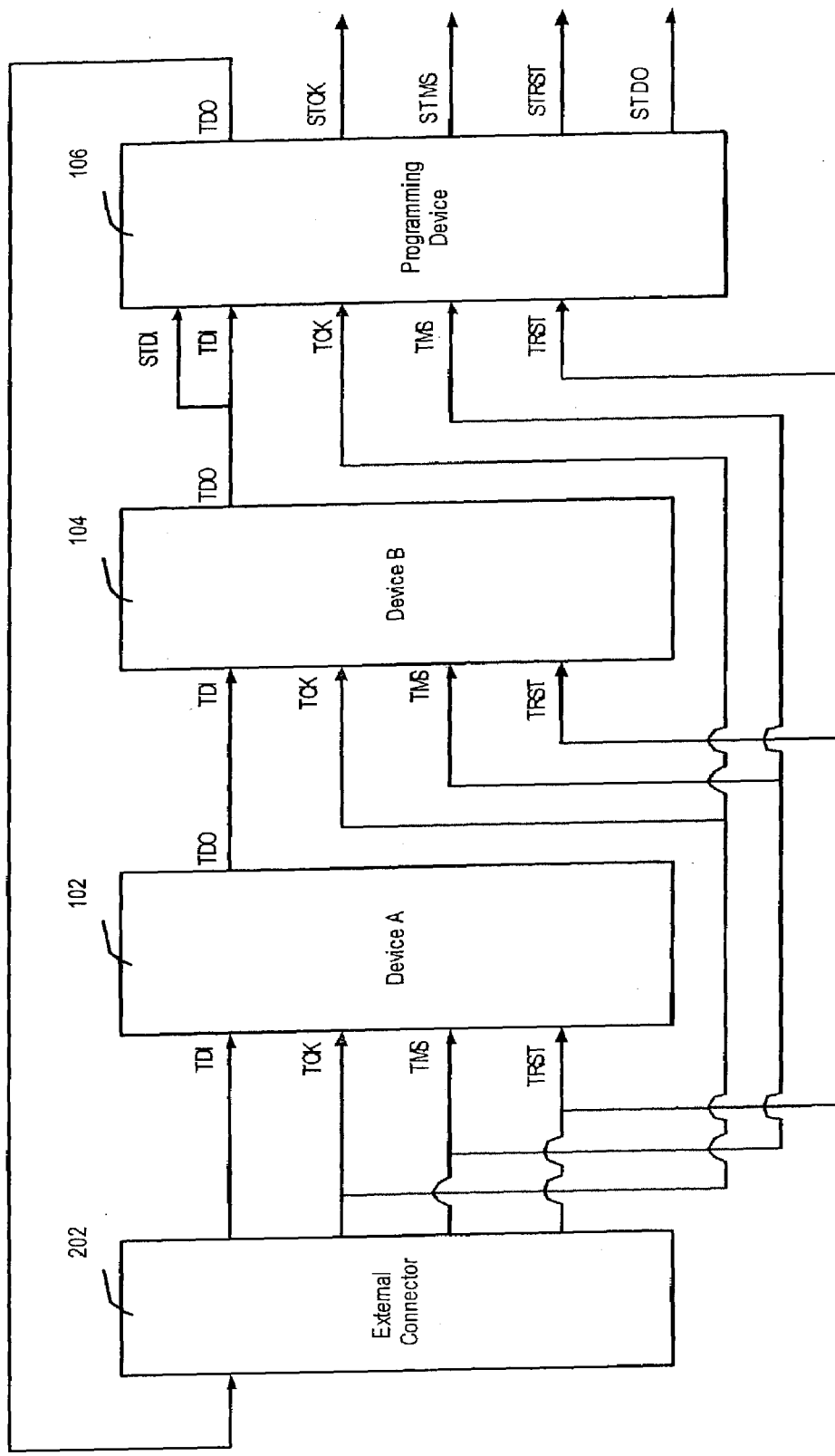
FIG. 2 depicts a scan chain as would be used for external testing and/or programming according to one embodiment of the present invention.

FIG. 2 depicts the same devices as FIG. 1 (except for memory device 108 which is not used) but configured into a scan chain used for testing and/or programming via an external connector 202. External connector 202 acts as the source of JTAG programming and/or test data. Appropriate JTAG test stimulation and verification may be provided by systems and devices available from, e.g., Gopel Inc. of Jena, Germany. The TCK, TMS and TRST signals are branched out from the external connector to all three devices. The JTAG scan data is fed from external connector 202 to TDI of device A 102, then out the TDO pin of device A 102 to the TDI pin of device B 104, out the TDO pin of the device B 104, and then into the TDI pin of the programming device 106. Scan data is returned to external connector 202 from the TDO pin of programming device 106. In this configuration, programming device 106 is merely another device that can be programmed and/or tested via the external connector 202. The simulated JTAG outputs of programming device 106 are not used in this configuration.

Figure 3:
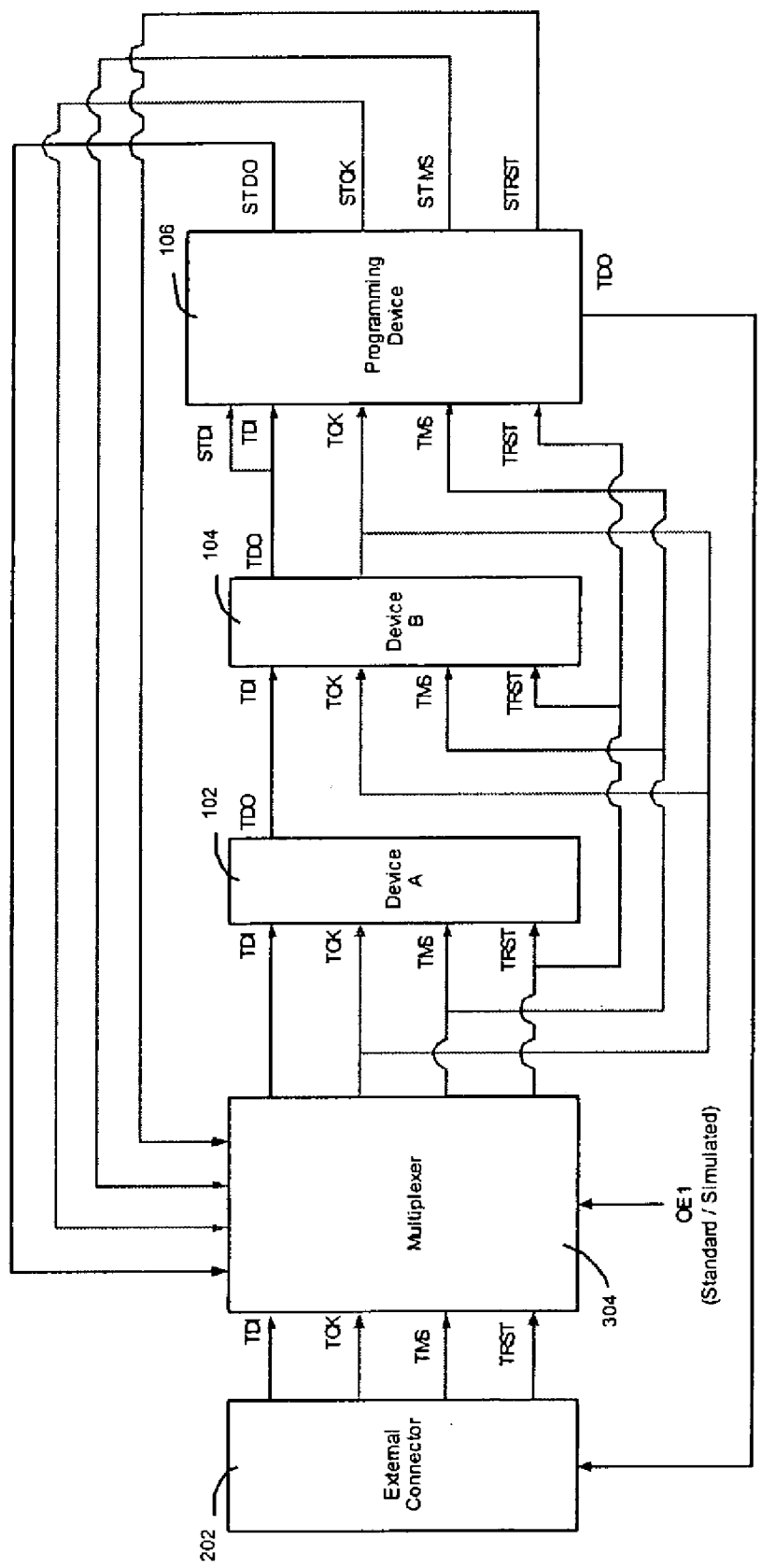
FIG. 3 depicts interconnections between electronic devices capable of switching between the operation mode shown in FIG. 1 and the operation mode shown in FIG. 2 according to one embodiment of the present invention.

FIG. 3 depicts how one may select between the scanned configurations of FIG. 1 and FIG. 2 according to one embodiment of the present invention. This is accomplished by the use of multiplexer 304. Multiplexer 304 selects between the simulated JTAG outputs of programming device 106 and the standard JTAG signals provided by external connector 202. To implement the internal programming function of FIG. 1, multiplexer 304 couples the simulated JTAG outputs of programming device 106 to the standard JTAG inputs of device A 102. To implement the external programming and/or testing function of FIG. 2, multiplexer 304 couples the JTAG signals of external connector 202 to the JTAG inputs of device A 102. In one implementation, output enable signal OE1 is asserted to select internal programming and negated to select external programming and/or testing.

It will be understood that statements as to assertion and negation of output enable lines pertain to logical assertion or negations. In many implementations, a logical assertion is signified by a low voltage and a logical negation by a high voltage.

Multiplexer 304 may be implemented as an integrated circuit multiplexer device such as a 74x257. Alternatively, the multiplexer can be implemented as a pair of buffer blocks with one buffer block being activated while the other is deactivated to appropriately switch between inputs. For example, the 74x125 or 74x244 may be used where x represents a particular technology type. Also, the term "buffer" encompasses, e.g., drivers and many other types of circuits that are capable of setting an output at high impedance when deactivated or retransmitting an input signal when activated. Certain types of devices may output a negated version of the input signal when activated. For any of the devices used, an appropriate technology type should be selected to match voltage levels to those used in the rest of the circuit.

Figure 4A:
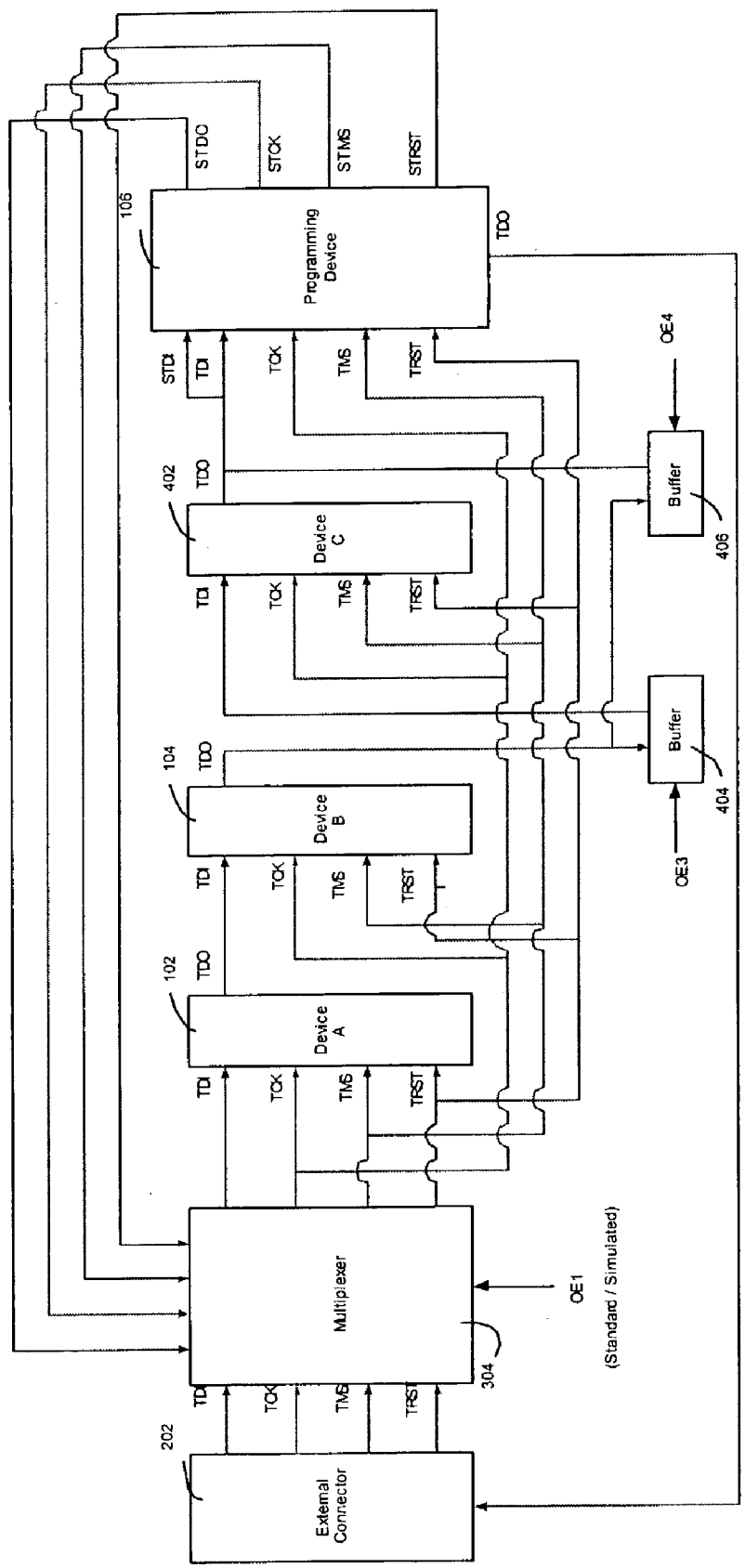
FIGS. 4A–4B depict how an additional device may be added to or removed from the scan chain of FIG. 3 according to one embodiment of the present invention.

FIG. 4A depicts a variant of the architecture of FIG. 3 where an additional device may be inserted into or deleted from the scan chain. A device C 402 may be inserted into or deleted from the scan chain by appropriate control of buffers 404 and 406 which may be implemented as described above. Buffers 404 and 406 are activated by lines OE3 and OE4 respectively. To include device C 402 in the scan chain, buffer 404 is activated and buffer 406 is deactivated. To exclude device C 402, buffer 404 is deactivated and buffer 406 is activated. It will be appreciated then that the present invention also encompasses more complex scanning hierarchies where numerous devices or groups of devices may be inserted or deleted from scan chains used for external or internal programming and/or testing operations.

Figure 4B:
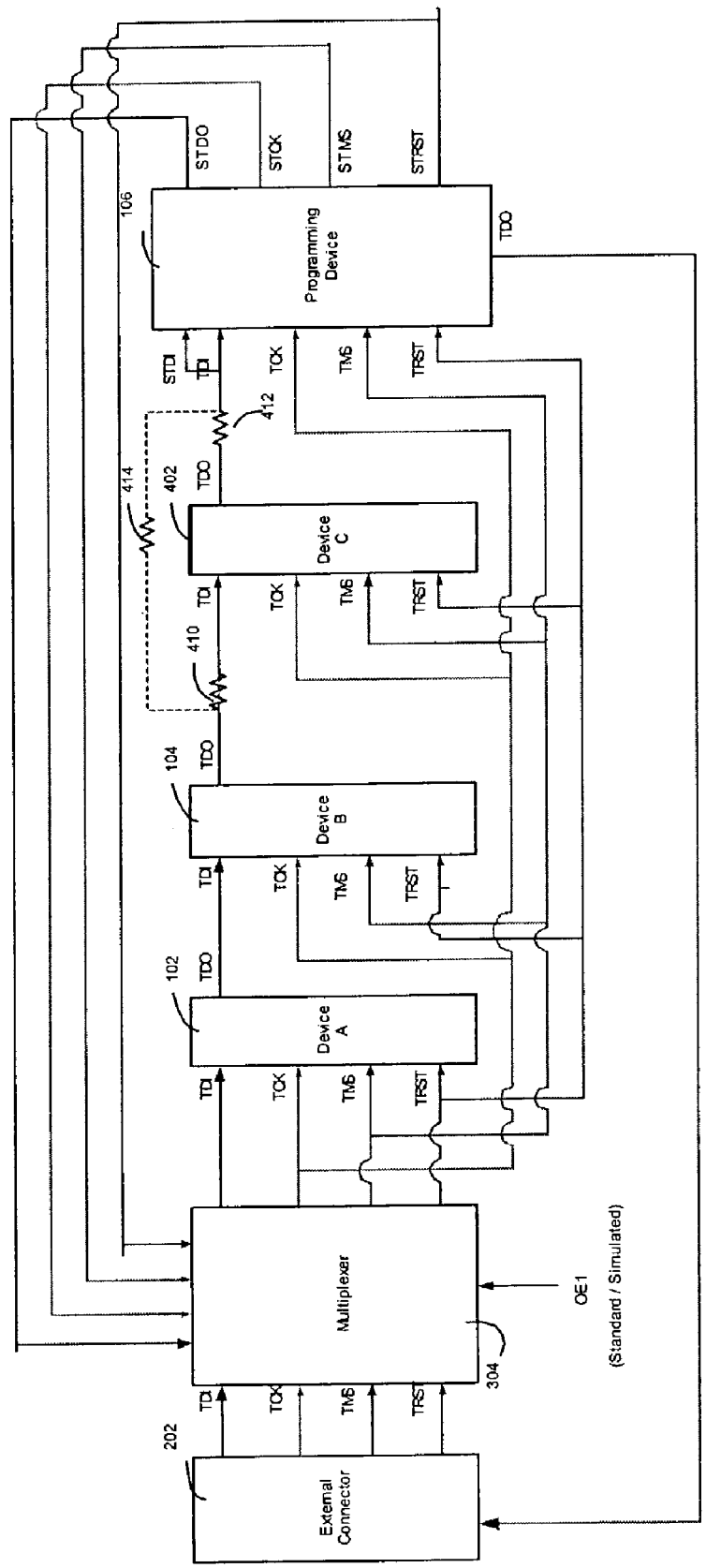

FIG. 4B depicts an alternative mechanism according to the present invention for inserting and removing device C 402 from the scan chain. When device C is to be included, a zero ohm resistor 410 is inserted in the scan chain between TDO of device B 104 and TDI of device C 402. A zero ohm resistor 412 is similarly inserted between TDO of device C 402 and TDI and STDI of programming device 106. To remove device C 402 from the scan chain, a zero ohm resistor 414 is inserted between TDO of device B 104 and TDI/STDI of programming device 106 while resistors 410 and 412 are removed.

Figure 5:
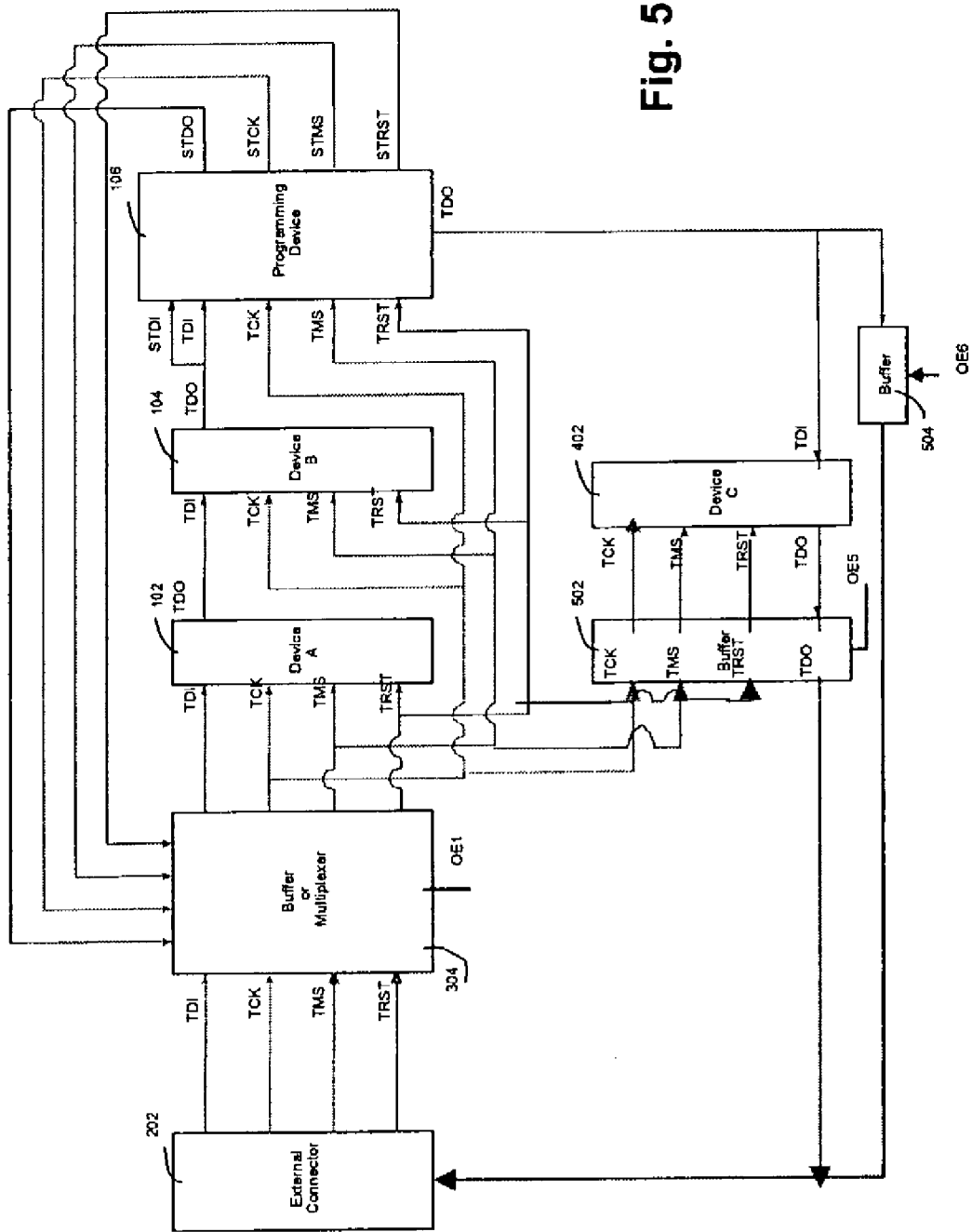
FIG. 5 depicts an alternative structure for removing or inserting a device in the scan chain according to one embodiment of the present invention.

FIG. 5 depicts another alternative mechanism for inserting and removing device C from the scan chain. Buffers 502 and 504 are provided and are activated by lines OE5 and OE6 respectively. Device C 402 is inserted into the scan chain by activation of buffer 502 and deactivation of buffer 504 and removed from the scan chain by deactivation of buffer 502 and activation of buffer 504. In the arrangement of FIG. 5, however, device C 402 cannot be programmed from programming device 106.

Figure 6:
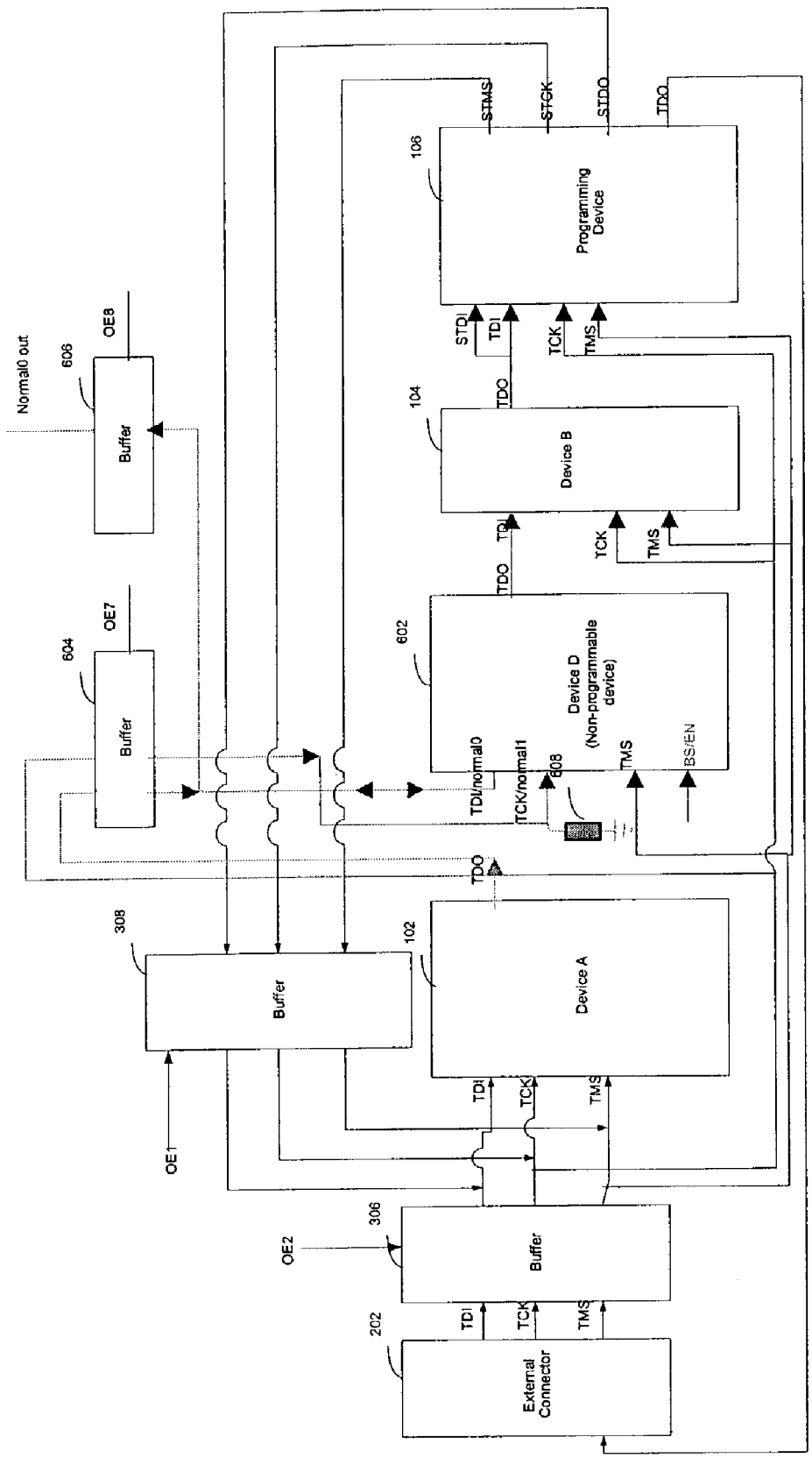
FIG. 6 depicts how a device having multi-function pins may be accommodated within the architecture of FIG. 3 according to one embodiment of the present invention.

FIG. 6 depicts a modification of the architecture of FIG. 3 wherein a device D 602 multiplexes multiple functions onto certain JTAG serial interface pins. Device D 602 is nonprogrammable. In particular, in FIG. 6, TDI of device D 602 can also be used as an output, normal0, and TCK of device D 602 can also be used as a different input, normal1. This beneficially allows JTAG capability to be added to device D 602 with lower pin count. Buffers 604 and 606 are provided to allow switching between JTAG and normal PCB operation (non-JTAG) modes. Buffers 604 and 606 are activated by signals OE7 and OE8 respectively. In JTAG mode, buffer 604 is activated so that TDO of device A 102 is coupled to TDI/normal0 of device D 602. Also, a BS/EN mode pin is set to BS. This pin can be set, e.g., via a DIP switch or via external connector 202. Activation of buffer 604 also causes TCK/normal1 of device D 602 to be coupled to the TCK line distributed among the various devices. Also, during JTAG mode, buffer 606 is deactivated so that other devices receiving the normal0 signal see high impedance rather than JTAG data.

During non-JTAG mode, buffer 604 is deactivated while buffer 606 is activated. The BS/EN pin is set to EN. The normal0 signal outputs to devices (not shown) on the other side of buffer 606. By deactivating buffer 604, the TCK signal of other devices in the scan chain is disconnected from the TCK/normal1 pin of device D. The TCK/normal1 pin can thus monitor normal1 activity instead. In the depicted implementation, the normal1 input is simply set low in normal operation mode by a pulldown resistor 608. Pulldown resistor 608 does not affect JTAG operation. Deactivating buffer 604 also disconnects the TDO output pin of device A 102 from normal0 signal activity at the TDI/normal0 pin of device D 602. The TRST signal is omitted from FIG. 6 for simplicity of illustration.

Also, it will be seen that in FIG. 6, multiplexer 304 is replaced by two buffers 306 and 308 to show this particular type of configuration. To select internal programming OE1 is asserted to activate buffer 308 while OE2 is negated to deactivate buffer 306. To select external programming and/or testing, OE1 is negated to deactivate buffer 308 while OE2 is asserted to activate buffer 306.

The easy configurability of scan chains provided by embodiments of the present invention gives rise to many advantages. One can test and program externally at manufacture time or program internally, e.g., at PCB start-up. One can easily insert or remove particular devices from a scan chain. Devices with multiplexed boundary scan pins are readily accommodated.

It will be appreciated that in the embodiments described above, a relatively small number of devices are used. The architecture provided by the present invention, however, can accommodate a very large number of devices with complex scanning hierarchies. This is readily facilitated by use of the buffers and/or multiplexers.

Also, by appropriately sourcing output enable signals of the various buffers and/or multiplexers via the external connector, one may provide for automatic configuration of the scan chain upon insertion of the mate to the on-board connector. Through appropriate buffering, the external connector may also import and distribute other signals.

It is understood that the examples and embodiments that are described herein are for illustrative purposes only and that various modifications and changes in light thereof will be suggested to persons skilled in the art and are to be included within the spirit and purview of this application and scope of the appended claims and their full scope of equivalents. For example, it should be understood that the term "external connector" encompasses other types of external access to the circuit including test points, etc.

The invention claimed is:

1. A method of operating a card having a plurality of devices, said method comprising:
    providing a plurality of devices in a scan chain, each of said devices having a serial interface for programming and/or testing;
    operating said card in a first mode wherein a first one of said plurality of devices is programmed or tested via an external connector and the serial interface;
    switching said card from said first mode to a second, wherein a second one of said plurality of devices is programmed from the serial interface and a source internal to said card; and
    operating said card in said second mode;
    wherein said source internal to said card is a third one of said plurality of devices in the scan chain in said first and second modes.

2. The method of claim 1 wherein said first one of said plurality of devices and said second one of said plurality of devices are the same device.

3. The method of claim 1 wherein said first one of said plurality of devices and said second one of said plurality of devices are different devices.

4. The method of claim 1 wherein said serial interface comprises a JTAG serial interface.

5. The method of claim 1 wherein operating said card in said first mode comprises including the serial interface of said first one of said plurality of devices in a first scan chain coupled to said external connector.

6. The method of claim 5 wherein operating said card in said second mode comprises including the serial interface of said second one of said plurality of devices in a second scan chain coupled to said internal source.

7. The method of claim 6 further comprising:
    selecting said first mode by activating a first buffer and deactivating a second buffer to connect together serial interfaces of said first scan chain and connect said external connector to said first scan chain.

8. The method of claim 6 further comprising:
    selecting said second mode by deactivating said first buffer and activating said second buffer to connect together serial interfaces of said second scan chain.

9. The method of claim 1 further comprising providing pins corresponding to the serial interface for use in said first mode and providing simulated serial interface outputs on a programming device for use in performing programming operations in said second mode.

10. The method of claim 1 further comprising inserting a new device into said plurality of devices.

11. The method of claim 10 further comprising activating buffers to include said new device in a scan chain comprising said plurality of devices.

12. The method of claim 1 further comprising deleting a device from said plurality of devices.

13. The method of claim 12 further comprising inserting a zero ohm resistor into a scan chain between said plurality of devices.

14. Apparatus for operating a card, said apparatus comprising:
    a plurality of devices in a scan chain, each of said devices having a serial interface for programming and/or testing;
    an external connector; and a multiplexer;

wherein in a first mode said multiplexer selects signals from said external connector to externally program and/or test a selected one of said plurality of devices via its serial interface;

wherein in a second mode, said multiplexer selects signals from an internal programming source to program said selected one of said plurality of devices via its serial interface; and wherein said programming source is one of said plurality of devices in the scan chain in said first and second modes, and is externally testable via said external connector in said first mode.

15. The apparatus of claim 14 wherein in said first mode, said selected device forms a part of the scan chain accessible via said external connector.

16. The apparatus of claim 15 further comprising:
a buffer that is selectively activatable to include at least one additional device of said plurality of devices in said scan chain.

17. The apparatus of claim 14 wherein in said second mode, said selected device forms part of a scan chain accessible to said programming source.

18. The apparatus of claim 14 wherein said serial interface comprises a JTAG interface.

19. The apparatus of claim 14 wherein at least one pin employed by said serial interface of said selected device has a function independent of programming and/or testing.

20. The apparatus of claim 19 further comprising:
a buffer selectively activatable to feed a signal unrelated to programming and/or testing to said pin.

21. The apparatus of claim 14 wherein at least one of said plurality of devices has a direct connection to said internal programming source without passing through the multiplexer.

22. The apparatus of claim 14 further comprising:
a new device positioned within the scan chain; and
a pair of buffers coupled to the new device;
wherein the buffers are configured such that a first of said pair of buffers is activated and a second of said pair of buffers is deactivated to include the new device in the scan chain, and said first buffer is deactivated and said second buffer is activated to exclude the device from the scan chain.

23. Apparatus for operating a card having a plurality of devices, said apparatus comprising:
means for providing a plurality of devices in a scan chain, each of said devices having a serial interface for programming and/or testing;
means for operating said card in a first mode wherein a first one of said plurality of devices is programmed or tested via an external connector and the serial interface;
means for switching said card from said first mode to a second mode, wherein a second one of said plurality of devices is programmed from the serial interface and a source internal to said card; and
means for operating said card in said second mode;
wherein said source internal to said card is a third one of said plurality of devices in the scan chain in said first and second modes.

24. The apparatus of claim 23 wherein said first one of said plurality of devices and said second one of said plurality of devices are the same device.

25. The apparatus of claim 23 wherein said first one of said plurality of devices and said second one of said plurality of devices are different devices.

26. The apparatus of claim 23 wherein said serial interface comprises a JTAG serial interface.

* * * * *